(12) United States Patent
Wang

(10) Patent No.: US 11,825,668 B2
(45) Date of Patent: Nov. 21, 2023

(54) DISPLAY PANEL, DISPLAY METHOD THEREOF, AND DISPLAY EQUIPMENT

(71) Applicant: Wuhan China Star Optoelectronics Semiconductor Display Technology Co., Ltd., Wuhan (CN)

(72) Inventor: Lei Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/047,133

(22) PCT Filed: Jun. 29, 2020

(86) PCT No.: PCT/CN2020/098751
§ 371 (c)(1),
(2) Date: Oct. 13, 2020

(87) PCT Pub. No.: WO2021/203559
PCT Pub. Date: Oct. 14, 2021

(65) Prior Publication Data
US 2023/0112762 A1    Apr. 13, 2023

(30) Foreign Application Priority Data
Apr. 10, 2020 (CN) ......................... 202010278323.2

(51) Int. Cl.
*H10K 59/121* (2023.01)
*H10K 77/10* (2023.01)
(Continued)

(52) U.S. Cl.
CPC ....... *H10K 59/1213* (2023.02); *G09G 3/2003* (2013.01); *G09G 3/3208* (2013.01);
(Continued)

(58) Field of Classification Search
None
See application file for complete search history.

(56) References Cited

U.S. PATENT DOCUMENTS 6,496,028 B1 * 12/2002 Manhaeve ......... G01R 31/3004
324/762.01
H2114 H * 2/2005 Novak .......................... 356/124
(Continued)

FOREIGN PATENT DOCUMENTS

CN    107248520 A    10/2017
CN    107302007 A    10/2017
(Continued)

*Primary Examiner* — Srinivas Sathiraju
(74) *Attorney, Agent, or Firm* — Nathan & Associates; Menachem Nathan

(57) ABSTRACT

A display panel, a display method thereof, and a display equipment are provided. The display panel includes a flat display part and a bending display part. A first thin film transistor is in the flat display part, and a second thin film transistor is in the bending display part. A ratio of a channel width to a channel length of an active layer of the first thin film transistor is greater than a ratio of a channel width to a channel length of an active layer of the second thin film transistor of the second thin film transistor. The display method includes a step of making a luminescence intensity of the bending display part greater than a luminescence intensity of the flat display part. The display equipment includes the display panel mentioned above.

20 Claims, 5 Drawing Sheets

(51) Int. Cl.
*G09G 3/20* (2006.01)
*G09G 3/3208* (2016.01)
*H10K 102/00* (2023.01)

(52) U.S. Cl.
CPC ... *H10K 77/111* (2023.02); *G09G 2300/0452* (2013.01); *G09G 2320/0686* (2013.01); *H10K 2102/311* (2023.02)

(56) References Cited

U.S. PATENT DOCUMENTS

| | | | | |
|---|---|---|---|---|
| 8,183,539 | B2 * | 5/2012 | Huang | H01J 37/153 250/281 |
| 10,001,809 | B2 * | 6/2018 | Seo | G09F 27/005 |
| 10,957,754 | B2 * | 3/2021 | Lee | H01L 27/1248 |
| 11,275,473 | B2 * | 3/2022 | Bok | G09G 3/3225 |
| 11,355,716 | B2 * | 6/2022 | Zhang | H10K 77/111 |
| 11,450,706 | B2 * | 9/2022 | Saeki | H01L 27/14685 |
| 11,518,146 | B2 * | 12/2022 | Brennan | B32B 27/365 |
| 11,550,148 | B2 * | 1/2023 | Chae | B29D 11/00596 |
| 11,586,306 | B2 * | 2/2023 | Boggs | B32B 17/10853 |
| 11,607,958 | B2 * | 3/2023 | Kumar | E06B 3/549 |
| 11,635,861 | B2 * | 4/2023 | Bok | H01Q 1/38 345/174 |
| 11,660,963 | B2 * | 5/2023 | Benjamin | C03C 27/10 156/382 |
| 11,685,684 | B2 * | 6/2023 | Gahagan | C03B 23/023 428/156 |
| 11,685,685 | B2 * | 6/2023 | Cho | C03B 23/0357 65/106 |
| 2003/0197665 | A1 * | 10/2003 | Sung | G09G 3/3233 345/82 |
| 2006/0001623 | A1 | 1/2006 | Sung | |
| 2010/0243879 | A1 * | 9/2010 | Huang | H01J 37/05 250/281 |
| 2017/0263690 | A1 * | 9/2017 | Lee | H10K 59/1213 |
| 2018/0074675 | A1 * | 3/2018 | Soh | G06F 3/043 |
| 2019/0051230 | A1 * | 2/2019 | Jeon | H10K 59/351 |
| 2019/0073946 | A1 | 3/2019 | Su | |
| 2020/0302865 | A1 * | 9/2020 | Lu | G09G 3/2003 |
| 2020/0393936 | A1 * | 12/2020 | Bok | H10K 59/40 |
| 2021/0026497 | A1 * | 1/2021 | Lee | G06F 3/0448 |
| 2021/0184139 | A1 * | 6/2021 | Zhang | H10K 77/111 |
| 2021/0204416 | A1 * | 7/2021 | Ahn | H05K 7/20963 |
| 2021/0320163 | A1 * | 10/2021 | Bang | H10K 59/131 |
| 2021/0399070 | A1 * | 12/2021 | Jung | H10K 77/111 |
| 2022/0187947 | A1 * | 6/2022 | Bok | H01Q 1/38 |
| 2022/0263035 | A1 * | 8/2022 | Zhang | H10K 59/131 |
| 2023/0112762 | A1 * | 4/2023 | Wang | H10K 50/11 345/690 |

FOREIGN PATENT DOCUMENTS

| | | |
|---|---|---|
| CN | 107331304 A | 11/2017 |
| CN | 107437400 A | 12/2017 |
| CN | 108492775 A | 9/2018 |

* cited by examiner

DISPLAY PANEL, DISPLAY METHOD THEREOF, AND DISPLAY EQUIPMENT

FIELD OF INVENTION

The present disclosure relates to the field of display technology, and more particularly, the present disclosure is a display panel, a display method thereof, and a display equipment.

BACKGROUND OF INVENTION

Organic light emitting diodes (OLEDs) are a next generation display technology, which have advantages of high contrast, wide color gamut, self-illumination, rapid response times, etc. Particularly, the OLEDs have wide application range in flexible display technology. For example, they have been applied more and more widely in mobile terminals such as mobile phones, tablet PCs, bracelets, etc., and have great market value.

Currently, in order to reduce bezel dimensions of panels to obtain more aesthetically pleasing appearances, bending edge technology of panels is used on many OLED displays to bend edges of display panels, thereby making bezels originally shown on a front view direction be hidden on lateral sides of the display panels. Therefore, users cannot see the edges bent to back surfaces of the display panels from the front of display devices, so higher screen-to-body ratio can be obtained. However, bending regions of the panels have wider viewing angles, so display brightness of traditional panels in the bending regions will be significantly lower than display brightness of the panels in flat regions for the users, which vastly lowers user experience of terminals for the users.

Therefore, an OLED display having good display effect in the bending regions urgently needs to be provided to allow the bending region and the flat region of the OLED displays to have similar or even completely same display brightness for the users after the edges are bent, thereby improving the display effect of the bending screens.

In order to solve the problem of different brightness between the bending region and the flat region of traditional OLED displays for the users after the edges are bent, the present disclosure provides a display panel, a display method thereof, and a display equipment. After edges of the OLED display of the present disclosure are bent, a bending region and a flat region have nearly same or completely same display brightness for the users, so the present disclosure can significantly improve the display effect of the bending panel.

SUMMARY OF INVENTION

In order to realize the technical purpose mentioned above, the present disclosure specifically provides a display panel. The display panel includes a flat display part and a bending display part located on an edge of the flat display part. The first thin film transistor is in the flat display part, and the second thin film transistor is in the bending display part. A ratio of a channel width to a channel length of an active layer of the first thin film transistor is a first setting value. A ratio of a channel width to a channel length of an active layer of the second thin film transistor is a second setting value. The first setting value is greater than the second setting value. Furthermore, the bending display part includes at least one of a top bending display part located on a top edge of the flat display part, a bottom bending display part located on a bottom edge of the flat display part, a left bending display part located on a left edge of the flat display part, or a right bending display part located on a right edge of the flat display part.

On the basis of the technical solution mentioned above, compared to the prior art, the present disclosure innovatively provides an improved edge bending display panel, which uniquely solves a problem that that different brightness between the bending region and the flat region of traditional OLED displays after the edge being bent for the users from a design angle of a channel of the active layer of the thin film transistor. By a method of reducing a channel width of the active layer of the thin film transistor to a channel length of the active layer, the users feel brightness of the bending region and the flat region being nearly consistent or even completely same, thereby thoroughly solving the problem that inconsistent display of brightness of the bending region and the flat region exists in current edge bending display screens. Therefore, extremely improves intuitive experience on the edge bending display screens to the users.

Furthermore, the active layer of the first thin film transistor includes a first red subpixel active layer. The active layer of the second thin film transistor includes a second red subpixel active layer. A ratio of a channel width to a channel length of the first red subpixel active layer is greater than a ratio of a channel width to a channel length of the second red subpixel active layer.

Furthermore, the channel width of the first red subpixel active layer is 4 μm, the channel length of the first red subpixel active layer is 25 μm, the channel width of the second red subpixel active layer is 2.2 μm, and the channel length of the second red subpixel active layer is 31 μm.

Furthermore, the active layer of the first thin film transistor includes a first green subpixel active layer. The active layer of the second thin film transistor includes a second green subpixel active layer. A ratio of a channel width to a channel length of the first green subpixel active layer is greater than a ratio of a channel width to a channel length of the second green subpixel active layer.

Furthermore, the channel width of the first green subpixel active layer is 4 μm, the channel length of the first green subpixel active layer is 25 μm, the channel width of the second green subpixel active layer is 2.5 μm, the channel length of the second green subpixel active layer is 28 μm.

Furthermore, the active layer of the first thin film transistor includes a first blue subpixel active layer. The active layer of the second thin film transistor includes a second blue subpixel active layer. A ratio of a channel width to a channel length of the first blue subpixel active layer is greater than a ratio of a channel width to a channel length of the second blue subpixel active layer.

Furthermore, the channel width of the first blue subpixel active layer is 4 μm, the channel length of the first blue subpixel active layer is 25 μm, the channel width of the second blue subpixel active layer is 2.3 μm, and the channel length of the second blue subpixel active layer is 30 μm.

Furthermore, the bending display part and the flat display part are an integrated structure.

In order to realize the purpose mentioned above, the present disclosure provides a display method of any display panel mentioned above, and the display method includes following step.

When the display panel works normally, a luminescence intensity of a bending display part is made to be greater than a luminescence intensity of a flat display part by making a ratio of a channel width to a channel length of an active layer of the second thin film transistor less than a ratio of a channel width to a channel length of an active layer of the first thin film transistor.

On the basis of the technical solution mentioned above, compared to the prior art, the present disclosure innovatively provides an improved edge bending display panel, which uniquely solves a problem that that different brightness between the bending region and the flat region of traditional OLED displays after the edge being bent for the users from a design angle of a channel of the active layer of the thin film transistor. By a method of making the ratio of the channel width to the channel length of the active layer of the bending region of the thin film transistor less than the ratio of the channel width to the channel length of the active layer of the flat region of the thin film transistor, the users feel brightness of the bending region and the flat region being nearly consistent or even completely same, thereby thoroughly solving the problem that inconsistent display of brightness of the bending region and the flat region exists in current edge bending display screens. Therefore, extremely improves intuitive experience on the edge bending display screens to the users.

In order to realize the purpose mentioned above, the present disclosure further provides a display equipment. The display equipment includes any display panel mentioned above.

Compared to the prior art, the present disclosure can significantly relieve the problem of brightness difference between the bending region and the flat region of the edge bending display devices, which can allow the users to perceive the brightness of the bending region and the flat region to be nearly same or even completely same to achieve the purpose of improving user experience. Moreover, on the basis of regulating brightness difference between the bending region and the flat region of the display device, the present disclosure can further effectively prevent the problem of color deviation between the bending region and the flat region. The present disclosure solves the problem of color deviation between the bending region and the flat region of the screen by structural adjustment of the channel of the active layer of the thin film transistor. Compared to some current logical control methods such as controlling grayscale values of pixel, the present disclosure has significantly higher reliability and stability. Furthermore, the present disclosure has a "once and for all" effect, that is, after the channel width and the channel length of the active layer of the corresponding thin film transistor is configured, there is no need to make additional effort for the brightness problem of the bending region. Therefore, cost of the present disclosure is lower and is suitable for batch production of display products.

DESCRIPTION OF DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which figures those skilled in the art can derive further figures without making any inventive efforts.

Figure 1:
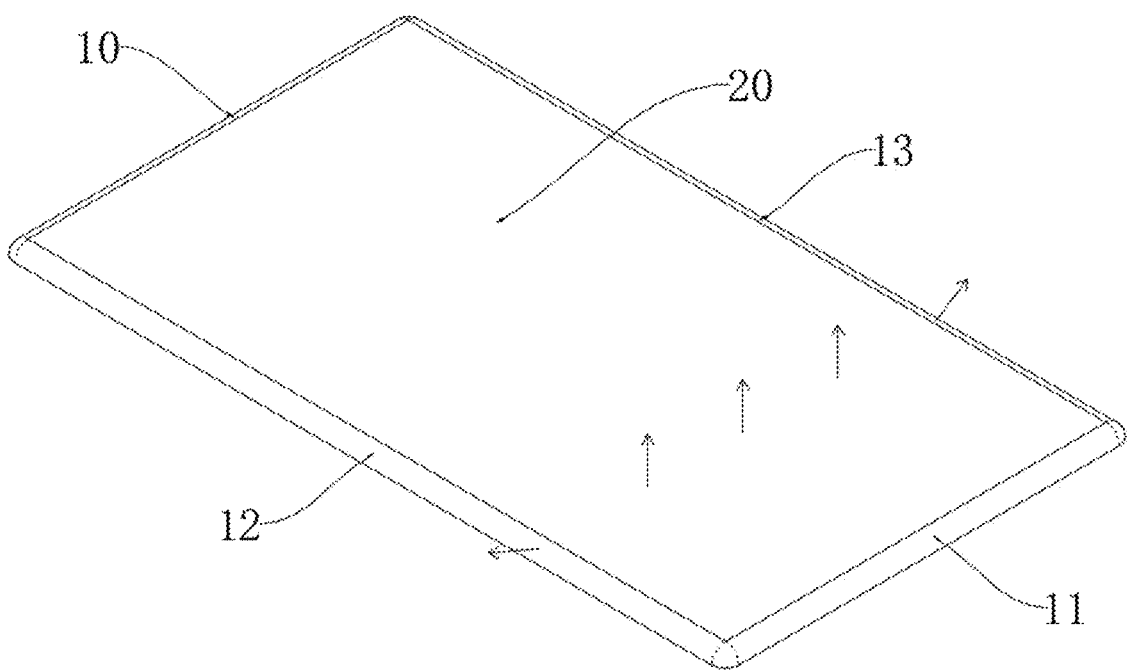
FIG. 1 is a three-dimensional structural schematic diagram of a display panel of an embodiment of the present disclosure, wherein arrows in the figure is used to indicate a luminescence direction of the display panel during operation.

In accompanying figures, 10, top bending display part; 11, bottom bending display part; 12, left bending display part; 13, right bending display part; 20, flat display part;

101, first red subpixel active layer; 102, first green subpixel active layer; 103, first blue subpixel active layer;

111, second red subpixel active layer; 112, second green subpixel active layer; 113, second blue subpixel active layer;

121, third red subpixel active layer; 122, third green subpixel active layer; 123, third blue subpixel active layer.

DETAILED DESCRIPTION OF PREFERRED EMBODIMENT

A display panel, a display method thereof, and a display equipment provided by each embodiment of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure. In the description of the present disclosure, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", etc is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

In the description of the present disclosure, unless specified or limited otherwise, terms "mounted," "connected," "coupled," "fixed," and the like are used in a broad sense, and may include, for example, fixed connections, detachable connections, or integral connections; may also be mechanical or electrical connections or may be communication between each other; may also be direct connections or indirect connections via intervening structures; may also be inner communications of two elements or may be a relationship of interaction between two elements. For persons skilled in the art in this field, the specific meanings of the above terms in the present disclosure can be understood with specific cases.

In the present disclosure, the term "exemplary" is used to mean "serving as an example, instance, or illustration." Any embodiment described in this application as "exemplary" is not necessarily to be interpreted as preferred or advantageous over other embodiments. The following description is presented for enable any person skilled in the art to make and use the present disclosure. In the following description, details are listed for the purpose of explanation. It should be understood that one skilled in the art will recognize that the present disclosure can be practiced without the specific details. In other embodiments, well-known structures and procedures are not described in detail to avoid unnecessary details making the description of the present disclosure to become opacity. Therefore, the present disclosure is not intended to be limited to the embodiments shown, but is in accordance with the broad scope of the principles and characteristics disclosed by present disclosure.

Regarding a traditional edge bending display panel similar to FIG. 1, and assuming that a flat region of the panel is FA and a bending region on left and right sides of the panel is CA, if a normal working screen is disposed horizontally, a luminescence direction of the flat region FA is perpendicularly upward. However, there must exist an included angle between a luminescence direction of the bending region CA and a vertical direction. Therefore, when the users directly face the screen, the users may feel that brightness of the bending region CA is less than brightness of the flat region FA, so user experience is poor. Furthermore, regarding the OLED display panel, color shift may occur between the bending region CA and the flat region FA incurred by microcavity effect thereof, and problems such as insufficient brightness and color shift are common in products already launched in markets. Analyzing the bending regions on top and bottom sides of the screen, the problems mentioned above also exists, and redundant description will not be mentioned herein again.

First Embodiment

This embodiment provides a display panel. Please refer to FIG. 1, FIG. 1 is a three-dimensional structural schematic diagram of a display panel of an embodiment of the present disclosure, wherein arrows in the figure is used to indicate a luminescence direction of the display panel during operation. Specifically, the display panel includes a flat display part 20 and a bending display part located on an edge of the flat display part 20. Thin film transistors are disposed in the display panel. Specifically, a first thin film transistor is in the flat display part 20, and a second thin film transistor is in the bending display part. A ratio of a channel width W1 to a channel length L1 of an active layer of the first thin film transistor is a first setting value W1/L1, and a ratio of a channel width W2 to a channel length L2 of an active layer of the second thin film transistor is a second setting value W2/L2. The ratio of the channel width to the channel length of the active layer of the thin film transistor of the bending region is made to be less than the ratio of the channel width to the channel length of the active layer of the thin film transistor of the flat region in this embodiment, that is, the first setting value W1/L1 is greater than the second setting value W2/L2. Furthermore, the bending display part includes at least one of a top bending display part 10 located on a top edge of the flat display part 20, a bottom bending display part 11 located on a bottom edge of the flat display part 20, a left bending display part 12 located on a left edge of the flat display part 20, or a right bending display part 13 located on a right edge of the flat display part 20, that is, there is a bending display part disposed on at least one edge of the top edge, the bottom edge, the left edge, or the right edge in the present disclosure, and one or more of the bending display parts can be disposed on edges having the bending display part. For example, respectively disposing bending display parts on the left edges and the right edge of the bending display part, then the display panel is a display panel having a left bending display part 12 and a right bending display part 13. As a preferred technical solution, and under consideration of reliability and cost, the bending display part and the flat display part 20 are an integrated structure. It should be noted that the display panel structure illustrated in FIG. 1 is used for describing one embodiment of the present disclosure. On the basis of disclosed contents of the present disclosure, modification or extension on structures of the product in FIG. 1 can be performed reasonably by combining contents described in the present disclosure. Similarly, product dimension scale in FIG. 1 of the present disclosure is only an exemplary presentation, which cannot be understood as limitations of forms of the product structures of the present disclosure.

It should be understood that all ratios of channel widths to channel lengths of active layers of each color subpixel of the thin film transistors of the bending region can be less than ratios of channel widths to channel lengths of active layers of each color subpixel of the thin film transistors of the flat region in this embodiment. Of course, the ratio of the channel width to the channel length of the active layer of at least one color of subpixels of the thin film transistor of the bending region can optionally be less than the ratio of the channel width to the channel length of the active layer of the corresponding subpixels of the thin film transistor of the flat region. For example, a ratio of a channel width to a channel length of an active layer of a red subpixel of the thin film transistor of the bending region can be made to be less than a ratio of a channel width to a channel length of an active layer of a red subpixel of the thin film transistor of the flat region, and/or a ratio of a channel width to a channel length of an active layer of a green subpixel of the thin film transistor of the bending region can be made to be less than a ratio of a channel width to a channel length of an active layer of a green subpixel of the thin film transistor of the flat region, and/or a ratio of a channel width to a channel length of an active layer of a blue subpixel of the thin film transistor of the bending region can be made to be less than a ratio of a channel width to a channel length of an active layer of a blue subpixel of the thin film transistor of the flat region.

Figure 2:
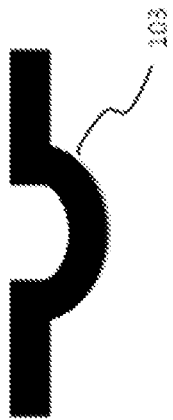
FIG. 2 is an appearance schematic diagram of a red subpixel active layer, a green subpixel active layer, and a blue subpixel active layer in a flat display part.
Figure 2:
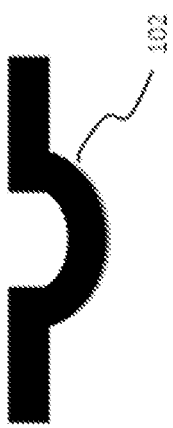
Figure 2:
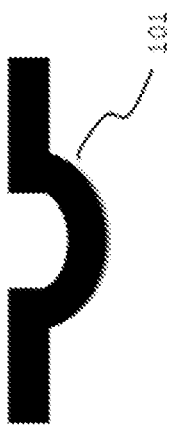
Figure 3:
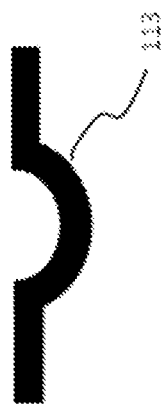
FIG. 3 is an appearance schematic diagram of a red subpixel active layer, a green subpixel active layer, and a blue subpixel active layer in a thin film transistor in a bending display part of an embodiment of the present disclosure.
Figure 3:
Figure 3:
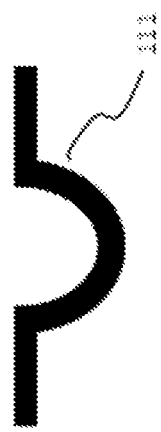

Please refer to FIG. 2, FIG. 2 is an appearance schematic diagram of a red subpixel active layer, a green subpixel active layer, and a blue subpixel active layer in the flat display part 20. The active layer of the first thin film transistor includes a first red subpixel active layer 101. Please refer to FIG. 3, FIG. 3 is an appearance schematic diagram of a red subpixel active layer, a green subpixel active layer, and a blue subpixel active layer in a thin film transistor in a bending display part of an embodiment of the present disclosure. The active layer of the second thin film transistor includes a second red subpixel active layer 111. A ratio of a channel width to a channel length of the first red subpixel active layer 101 is greater than a ratio of a channel width to a channel length of the second red subpixel active layer 111. The active layer of the first thin film transistor further includes a first green subpixel active layer 102. The active layer of the second thin film transistor further includes a second green subpixel active layer 112. A ratio of a channel width to a channel length of the first green subpixel active layer 102 is greater than a ratio of a channel width to a channel length of the second green subpixel active layer 112. The active layer of the first thin film transistor further includes a first blue subpixel active layer 103. The active layer of the second thin film transistor further includes a second blue subpixel active layer 113. A ratio of a channel width to a channel length of the first blue subpixel active layer 103 is greater than a ratio of a channel width to a channel length of the second blue subpixel active layer 113.

Please refer to FIG. 3, FIG. 3 is the appearance schematic diagram of the red subpixel active layer, the green subpixel active layer, and the blue subpixel active layer in the thin film transistor in the bending display part of an embodiment of the present disclosure. The channel width of the first red subpixel active layer 101 is 4 μm. The channel length of the first red subpixel active layer 101 is 25 μm. The channel width of the second red subpixel active layer 111 is 2.2 μm. The channel length of the second red subpixel active layer 111 is 31 μm. The channel width of the first green subpixel active layer 102 is 4 μm. The channel length of the first green subpixel active layer 102 is 25 μm. The channel width of the second green subpixel active layer 112 is 2.5 μm. The channel length of the second green subpixel active layer 112 is 28 μm. The channel width of the first blue subpixel active layer 103 is 4 μm. The channel length of the first blue subpixel active layer 103 is 25 μm. The channel width of the second blue subpixel active layer 113 is 2.3 μm. The channel length of the second blue subpixel active layer 113 is 30 μm. From the above, it can be understood that the channel widths and the channel lengths of the first red subpixel active layer 101, the first green subpixel active layer 102, and the first blue subpixel active layer 103 are made to be consistent in this embodiment. In order to improve luminescence brightness of the bending display part, compared to the ratios of the channel widths to the channel lengths of the red subpixel active layer, the green subpixel active layer, and the blue subpixel active layer of the flat display part, the ratios of the channel widths to the channel lengths of the red subpixel active layer, the green subpixel active layer, and the blue subpixel active layer of the bending display part are reduced correspondingly. However, in order to make the screen of the bending display part to be partial to green in FIG. 3, a reducing range of the ratios of the channel widths to the channel lengths of the red subpixel active layer and the blue subpixel active layer of the bending display part are greater than the ratio of the channel width to the channel length of the green subpixel active layer, that is, the ratios of the channel widths to the channel lengths of the red subpixel active layer and the blue subpixel active layer of the bending display part are configured to be smaller.

Figure 4:
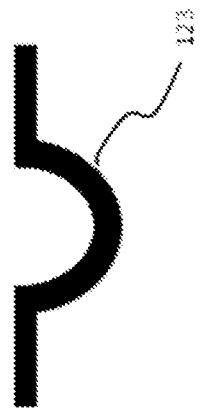
FIG. 4 is an appearance schematic diagram of the red subpixel active layer, the green subpixel active layer, and the blue subpixel active layer in the thin film transistor in the bending display part of another embodiment of the present disclosure.
Figure 4:
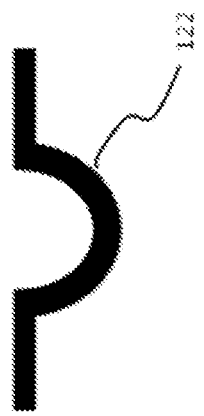
Figure 4:
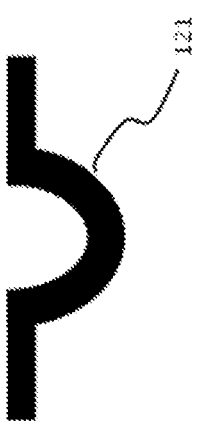

Similarly, the screen of the bending display part is also able to be partial to red or blue in this embodiment. The following takes the screen of the bending display part to be partial to red as an example. Please refer to FIG. 4, FIG. 4 is an appearance schematic diagram of the red subpixel active layer, the green subpixel active layer, and the blue subpixel active layer in the thin film transistor in the bending display part of another embodiment of the present disclosure. The channel width of the first red subpixel active layer 101 is 4 μm. The channel length of the first red subpixel active layer 101 is 25 μm. A channel width of a third red subpixel active layer 121 is 2.5 μm. A channel length of the third red subpixel active layer 111 is 28 μm. The channel width of the first green subpixel active layer 102 is 4 μm. The channel length of the first green subpixel active layer 102 is 25 μm. A channel width of the third green subpixel active layer 122 is 2.3 μm. A channel length of the third green subpixel active layer 122 is 30 μm. The channel width of the first blue subpixel active layer 103 is 4 μm. The channel length of the first blue subpixel active layer 103 is 25 μm. A channel width of the third blue subpixel active layer 123 is 2.3 μm. The channel length of the third blue subpixel active layer 123 is 29 μm. In FIG. 4, in order to make the screen of the bending display partial to red, a reducing range of the ratios of the channel widths to the channel lengths of the green subpixel active layer and the blue subpixel active layer of the bending display part are greater than the ratio of the channel width to the channel length of the red subpixel active layer, that is, the ratios of the channel widths to the channel lengths of the green subpixel active layer and the blue subpixel active layer of the bending display part are configured to be smaller. Regulating concept of the channel of the subpixel active layer of the thin film transistor with screen partial to blue of the bending display part is similar to this, and redundant description will not be mentioned herein again.

On the basis of the solution mentioned above, display brightness on a generated curved surface on the bending region of screen edges in front view for the users and display brightness of a plane (the flat region) for the users are made to be nearly consistent or completely same in the present disclosure, so the present disclosure significantly improves overall display effect of the bending edge screen. It should be noted that other components of the display panel of the present disclosure, such as a liquid crystal structure, a driving circuit structure, etc., can be selected reasonably and wisely from the prior arts according to actual requirements on the basis of disclosed contents of the present disclosure.

It should be clear that although some embodiments of specific values of the channel widths and the channel lengths of the subpixels of each color of the thin film transistors of the bending region are provided in this embodiment, when the display panel is specifically designed, the channel widths and the channel lengths of the subpixels of each color of the thin film transistors of the bending region should be adjusted adaptively according to actual requirements (including but not limited to a bending radian, a bending length, thin film transistor performance, etc.), and are subject to realization of the technical purpose of the present disclosure.

Second Embodiment

On the basis of same invention concept of the first embodiment, this embodiment provides a display method of the display panel in the first embodiment, wherein the display method includes following steps.

When the display panel works normally, a luminescence intensity of a bending display part is made to be greater than luminescence intensity of a flat display part by making a ratio of a channel width to a channel length of an active layer of the second thin film transistor o less than a ratio of a channel width to a channel length of an active layer of the first thin film transistor.

Figure 5:
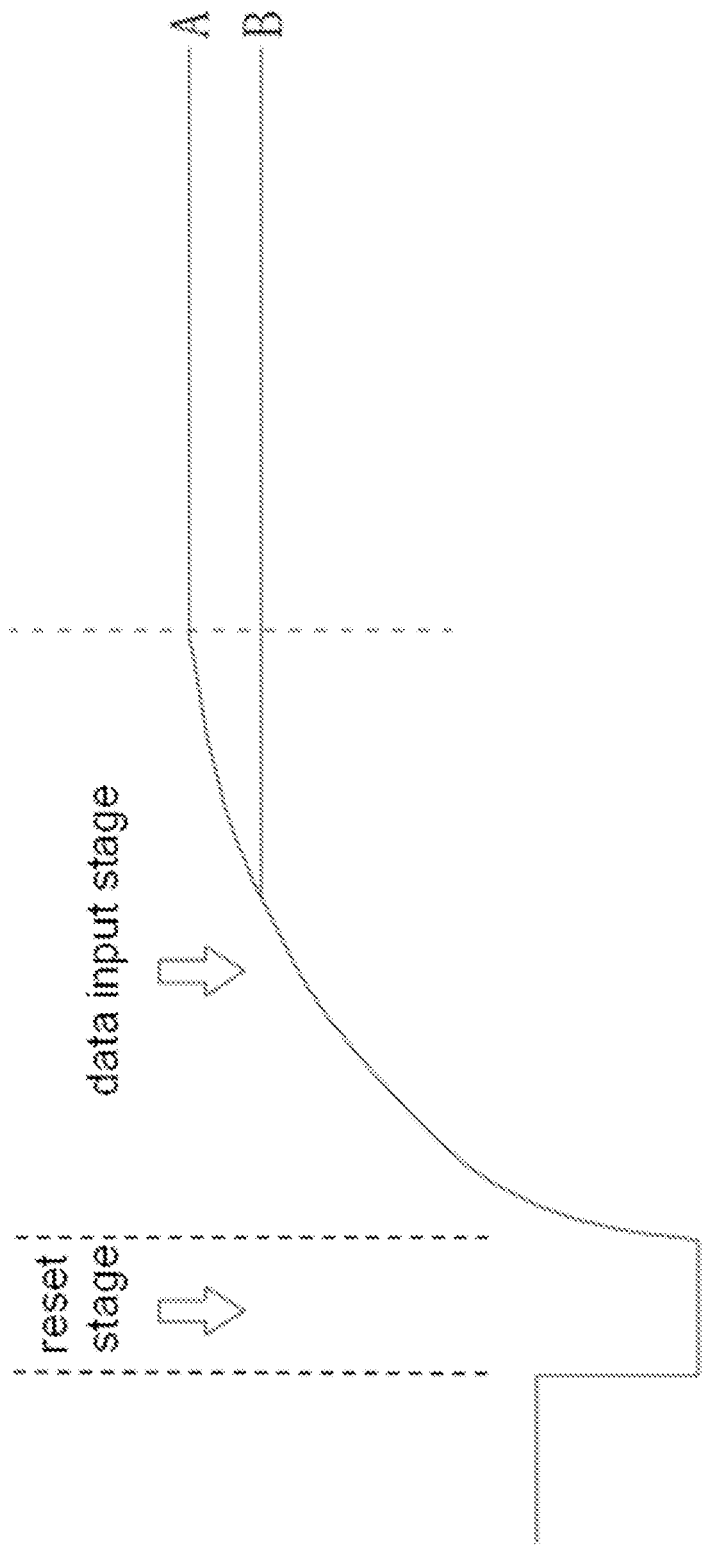
FIG. 5 is a curve schematic diagram of electric potential variation of a gate electrode of a driving thin film transistor during operation.

Please refer to FIG. 5, FIG. 5 is a curve schematic diagram of electric potential variation of a gate electrode of a driving thin film transistor during operation. In a whole process of operation of gate electrode driving thin film transistors of pixel electrodes, before corresponding subpixels emit light, electric potential of the gate electrodes operated by the driving thin film transistors can be divided into two stages. The first stage is a reset stage of electric potential of the gate electrodes, and the second stage is a data input stage. In a given time, a variation curve of the electric potential of the gate electrode of the thin film transistor of the flat region is illustrated as curve A in FIG. 5. Compared to the thin film transistor of the flat region, regarding to the thin film transistor of the bending region, after the ratio of channel width to the channel length of the active layer of the thin film transistor is reduced, data input speed can be slow, and electricity of data input into the driving thin film transistor (TFT) from the after-reset signal voltage is not sufficient. Therefore, negative values of the voltage are greater, so luminescence current and luminescence intensity are stronger. A variation curve of the electric potential of the gate electrode of the thin film transistor of the bending region is illustrated as curve B in FIG. 5. On the basis of the theory mentioned above and experimental verification, it can be understood that luminescence intensity of each subpixel can be selectively enhanced by reducing the ratios of the channel widths to the channel lengths of the active layers of the thin film transistors. Moreover, the brightness of the bending region can be adjusted comprehensively by comprehensively adjusting the red subpixel active layer, the blue subpixel active layer, and the green subpixel active layer of the thin film transistors of the bending regions to realize the purpose of consistent display brightness of the flat region and the bending region ultimately seen by the users, and then the purpose of consistent colors of the flat region and the bending region seen by the users is realized. Therefore, the present disclosure can reduce or eliminate a phenomenon of inconsistent display of chromaticity between the bending region and the flat region of traditional bending edge screen, thereby making chromaticity between the flat region and the bending region on the whole screen seen by the users be consistent.

Third Embodiment

A display device can include the display panel of any structural form in the first embodiment. The display device can be an OLED display device, that is, the present disclosure can provide an OLED display having good display effect on the bending region on the edge of the panel. The display device provided by the present disclosure can be used on any electronic equipment having a display function such as mobile phones, tablet PCs, televisions, laptops, electronic book equipment, etc. The related OLED display device mentioned above can be a passive matrix organic light emitting diode (PMOLED) display device, and can also be an active matrix organic light emitting diode display device (AMOLED) display device, which is usually a flexible display device during specific applications.

The above is only the preferred embodiments and is not intended to limit the present disclosure, and any modifications, equivalents, and improvements made within the spirit and scope of the present disclosure should be included in the scope of the present disclosure.

What is claimed is:

1. A display panel, comprising a flat display part and a bending display part located on an edge of the flat display part, a first thin film transistor is in the flat display part, a second thin film transistor is in the bending display part, a ratio of a channel width to a channel length of an active layer of the first thin film transistor is a first setting value, a ratio of a channel width to a channel length of an active layer of the second thin film transistor is a second setting value, and the first setting value is greater than the second setting value, wherein the bending display part comprises at least one of a top bending display part located on a top edge of the flat display part, a bottom bending display part located on a bottom edge of the flat display part, a left bending display part located on a left edge of the flat display part, or a right bending display part located on a right edge of the flat display part.

2. The display panel as claimed in claim 1, wherein the active layer of the first thin film transistor comprises a first red subpixel active layer, the active layer of the second thin film transistor comprises a second red subpixel active layer, and a ratio of a channel width to a channel length of the first red subpixel active layer is greater than a ratio of a channel width to a channel length of the second red subpixel active layer.

3. The display panel as claimed in claim 2, wherein the channel width of the first red subpixel active layer is 4 μm, the channel length of the first red subpixel active layer is 25 μm, the channel width of the second red subpixel active layer is 2.2 μm, and the channel length of the second red subpixel active layer is 31 μm.

4. The display panel as claimed in claim 1, wherein the active layer of the first thin film transistor comprises a first green subpixel active layer, the active layer of the second thin film transistor comprises a second green subpixel active layer, and a ratio of a channel width to a channel length of the first green subpixel active layer is greater than a ratio of a channel width to a channel length of the second green subpixel active layer.

5. The display panel as claimed in claim 4, wherein the channel width of the first green subpixel active layer is 4 μm, the channel length of the first green subpixel active layer is 25 μm, the channel width of the second green subpixel active layer is 2.5 μm, and the channel length of the second green subpixel active layer is 28 μm.

6. The display panel as claimed in claim 1, wherein the active layer of the first thin film transistor comprises a first blue subpixel active layer, the active layer of the second thin film transistor comprises a second blue subpixel active layer, and a ratio of a channel width to a channel length of the first blue subpixel active layer is greater than a ratio of a channel width to a channel length of the second blue subpixel active layer.

7. The display panel as claimed in claim 6, wherein the channel width of the first blue subpixel active layer is 4 μm, the channel length of the first blue subpixel active layer is 25 μm, the channel width of the second blue subpixel active layer is 2.3 μm, and the channel length of the second blue subpixel active layer is 30 μm.

8. The display panel as claimed in claim 1, wherein the bending display part and the flat display part are integrated structures.

9. A display method of a display panel, comprising following step:
    making a luminescence intensity of a bending display part greater than a luminescence intensity of a flat display part by making a ratio of a channel width to a channel length of an active layer of the second thin film transistor less than a ratio of a channel width to a channel length of an active layer of the first thin film transistor when the display panel works normally, wherein the display panel comprises the flat display part and the bending display part located on an edge of the flat display part, the first thin film transistor is in the flat display part, the second thin film transistor is in the bending display part, the ratio of the channel width to the channel length of the active layer of the first thin film transistor is a first setting value, the ratio of the channel width to the channel length of the active layer of the second thin film transistor is a second setting value, and the first setting value is greater than the second setting value, wherein the bending display part comprises at least one of a top bending display part located on a top edge of the flat display part, a bottom bending display part located on a bottom edge of the flat display part, a left bending display part located on a left edge of the flat display part, or a right bending display part located on a right edge of the flat display part.

10. The display method of the display panel as claimed in claim 9, wherein the active layer of the first thin film transistor comprises a first red subpixel active layer, the active layer of the second thin film transistor comprises a second red subpixel active layer, and a ratio of a channel width to a channel length of the first red subpixel active layer is greater than a ratio of a channel width to a channel length of the second red subpixel active layer.

11. The display method of the display panel as claimed in claim 10, wherein the channel width of the first red subpixel active layer is 4 μm, the channel length of the first red subpixel active layer is 25 μm, the channel width of the second red subpixel active layer is 2.2 μm, and the channel length of the second red subpixel active layer is 31 μm.

12. The display method of the display panel as claimed in claim 9, wherein the active layer of the first thin film transistor comprises a first green subpixel active layer, the active layer of the second thin film transistor comprises a second green subpixel active layer, and a ratio of a channel width to a channel length of the first green subpixel active layer is greater than a ratio of a channel width to a channel length of the second green subpixel active layer.

13. The display method of the display panel as claimed in claim 12, wherein the channel width of the first green subpixel active layer is 4 μm, the channel length of the first green subpixel active layer is 25 μm, the channel width of the second green subpixel active layer is 2.5 μm, and the channel length of the second green subpixel active layer is 28 μm.

14. A display equipment, comprising a display panel, wherein the display panel comprises a flat display part and a bending display part located on an edge of the flat display part, a first thin film transistor is in the flat display part, a second thin film transistor is in the bending display part, a ratio of a channel width to a channel length of an active layer of the first thin film transistor is a first setting value, a ratio of a channel width to a channel length of an active layer of the second thin film transistor is a second setting value, and the first setting value is greater than the second setting value, wherein the bending display part comprises at least one of a top bending display part located on a top edge of the flat display part, a bottom bending display part located on a bottom edge of the flat display part, a left bending display part located on a left edge of the flat display part, or a right bending display part located on a right edge of the flat display part.

15. The display equipment as claimed in claim 14, wherein the active layer of the first thin film transistor comprises a first red subpixel active layer, the active layer of the second thin film transistor comprises a second red subpixel active layer, and a ratio of a channel width to a channel length of the first red subpixel active layer is greater than a ratio of a channel width to a channel length of the second red subpixel active layer.

16. The display equipment as claimed in claim 15, wherein the channel width of the first red subpixel active layer is 4 μm, the channel length of the first red subpixel active layer is 25 μm, the channel width of the second red subpixel active layer is 2.2 μm, and the channel length of the second red subpixel active layer is 31 μm.

17. The display equipment as claimed in claim 14, wherein the active layer of the first thin film transistor comprises a first green subpixel active layer, the active layer of the second thin film transistor comprises a second green subpixel active layer, and a ratio of a channel width to a channel length of the first green subpixel active layer is greater than a ratio of a channel width to a channel length of the second green subpixel active layer.

18. The display equipment as claimed in claim 17, wherein the channel width of the first green subpixel active layer is 4 μm, the channel length of the first green subpixel active layer is 25 μm, the channel width of the second green subpixel active layer is 2.5 μm, and the channel length of the second green subpixel active layer is 28 μm.

19. The display equipment as claimed in claim 14, wherein the active layer of the first thin film transistor comprises a first blue subpixel active layer, the active layer of the second thin film transistor comprises a second blue subpixel active layer, and a ratio of a channel width to a channel length of the first blue subpixel active layer is greater than a ratio of a channel width to a channel length of the second blue subpixel active layer.

20. The display equipment as claimed in claim 19, wherein the channel width of the first blue subpixel active layer is 4 μm, the channel length of the first blue subpixel active layer is 25 μm, the channel width of the second blue subpixel active layer is 2.3 μm, and the channel length of the second blue subpixel active layer is 30 μm.

* * * * *